United States Patent [19]
Jones et al.

[11] Patent Number: 5,463,252
[45] Date of Patent: Oct. 31, 1995

[54] MODULAR SOLID STATE RELAY

[75] Inventors: Franklin B. Jones, Catonsville; Ngon B. Nguyen, Jessup; Leroy Laurandeau, Cockeysville, all of Md.

[73] Assignee: Westinghouse Electric Corp., Pittsburgh, Pa.

[21] Appl. No.: 130,401

[22] Filed: Oct. 1, 1993

[51] Int. Cl.$^6$ .............................. H01L 23/16; H01L 39/02
[52] U.S. Cl. .............................................. 257/723; 257/724
[58] Field of Search ................................... 257/107, 173, 257/723, 724, 706, 707; 361/101; 363/25, 26

[56] References Cited

U.S. PATENT DOCUMENTS

| | | |
|---|---|---|
| 4,360,851 | 11/1982 | Zundel ................................... 361/401 |
| 4,528,608 | 7/1985 | Anderson et al. ....................... 361/101 |
| 4,792,839 | 12/1988 | Strack et al. . |
| 4,929,856 | 5/1990 | Guning . |
| 5,359,211 | 10/1994 | Croft ........................................ 361/101 |
| 5,369,308 | 11/1994 | Schoofs et al. .......................... 361/101 |

*Primary Examiner*—Sara W. Crane
*Assistant Examiner*—S. V. Clark
*Attorney, Agent, or Firm*—Walter G. Sutcliff

[57] ABSTRACT

A solid state circuit breaker utilizing fast acting solid state relays which are made up of individual switching circuit modules using silicon metal oxide semiconductor field effect transistors or silicon carbide metal oxide semiconductor field effect transistors. Depending on the power requirements, the individual modules may be arranged to provide heat dissipation while at the same time minimizing the total overall space occupied in the circuit breaker.

17 Claims, 6 Drawing Sheets

MODULAR SOLID STATE RELAY

BACKGROUND OF INVENTION

1. Field of Invention

The present invention relates to a solid state relay; and more particularly, to a solid state relay for the selective interruption of high amperage direct current.

While the invention is subject to a wide range of applications, it is especially suited for use in a high amperage solid state circuit breaker used in DC systems, and is particularly described in that connection.

2. Description of Related Art

Conventional switches that utilize mechanical contactors are able to pass high current efficiently because the entire current path consists of metal conductors. However, opening the mechanical contact switch requires the physical movement of mechanical parts, which requires a switching time in the order of milliseconds. During this time, fault currents can build to high levels. In AC systems this is not a serious problem, because all AC current passes through zero on each cycle, at which time arc currents can be extinguished. In DC systems, however, there is no natural current reversal, and the high currents must be forcibly interrupted. The severe stresses and high energy dissipation of the arc can result in contact failure, which is a significant reliability problem.

In order to overcome the disadvantages of devices using only mechanical contactors to break a high amperage direct current, solid state relays have been proposed. In circuit breakers a solid state relay is able to interrupt fault currents with switching times in the order of a microsecond, for example, without arcing. Because of the speed of solid state switching, the fault currents may be limited to much lower levels than those seen in mechanical switches. Unfortunately, steady state currents must pass through a semiconductor junction, with the attendant forward voltage drop and power loss. This typically requires supplemental cooling for the solid state relay, either by forced air, conduction, or liquid cooling.

For applications where the direct current to be passed continuously is typically in the order of several hundred amperes, the total amount of power loss of semiconductor devices is limited by the volume available for cooling fins to transfer waste heat to the ambient air, and by the specified ambient and semiconductor junction temperatures. The maximum permissible forward voltage drop for a solid state switching relay, is calculated from these considerations, and is typically only a small fraction of a volt. This eliminates from consideration devices such as bipolar transistors and gate turn-off thyristors, for example, with a minimum voltage drop in excess of one volt regardless of the current passing through them. For such applications, it has been proposed to build a solid state relay with low conduction loss requiring the use of many metal oxide semiconductor field effect transistors (MOSFET's) in parallel. This requires that enough semiconductor devices be operated in parallel to provide a total resistance below one milliohm, for example. Thus, several hundred of these devices must often be used to meet such requirements. Such a proposed arrangement would provide faster operation, programmable trip characteristics, and potentially more reliable operation than mechanical circuit breakers because of the elimination of arcing due to the interruption of large DC fault currents. However, the disadvantages of this proposed arrangement are physical size, material costs, and production yield. It is well known that the more devices that are used in a single assembly, the less chance there is that they will all work properly the first time. When hundreds of devices are used in a single assembly, the chance that they will all work approaches zero. The large footprint area required for several hundred of the MOSFET devices in a single package, and the cost of conventional semiconductor packages or power hybrids renders their use impractical. Additionally, the cost of the heat sink itself is significantly increased by the need to include fins to increase thermal efficiency by breaking boundary layers. Further, the need to provide efficient electrical and thermal connections to the MOSFET devices results in complicated three-dimensional construction of bus bars and heat sinks which require extensive hand labor and assembly.

In light of the foregoing, there is a need for a solid state relay, and a circuit breaker incorporating a solid state relay, that is capable of operating at several hundred amperes with low resistance to continuous current, operates substantially faster and more reliably than a mechanical switch contactor, requires no cooling other than free air convection, does not occupy a large area, and is relatively easy to manufacture and assemble.

SUMMARY OF INVENTION

Accordingly, the present invention is directed to a solid state relay and circuit breaker that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the apparatus particularly pointed out in the written description and claims hereof as well as the appended drawings.

To achieve these and other advantages and in accordance with the purpose of the invention, as embodied and broadly described, the invention, in one aspect, is a solid state circuit breaker including a plurality of current carrying power poles each having an input for connection to a DC power source and an output for connection to an electrical load. A solid state relay is provided for each of the power poles operative when in one condition to permit the flow of DC current in the respective pole and operative when in a second condition to interrupt the flow of current in the respective pole. Each solid state relay includes a plurality of switching circuit modules, each module includes a thin metallic sheet with at least a plurality of field effect transistors mounted thereon. The plurality of field effect transistors of each module having commonly connected source electrodes, commonly connected drain electrodes, and commonly connected gate electrodes. The plurality of modules of each relay are parallel connected by the source and drain electrodes between the input and output of each power pole. A gate drive circuit is mounted to each of the sheet metal substrates and coupled to the respective commonly connected gate electrodes, the drive circuit being operable to turn the field effect transistors of the respective module to an off and on state; and means for operating the drive circuit.

In another aspect, the invention is a solid state switching relay, comprising a plurality of switching circuit modules, each module includes a thin sheet metal heat dissipating substrate with at least a plurality of field effect transistors mounted thereon, the transistors of each module having commonly connected source electrodes, commonly connected drain electrodes, and commonly connected gate electrodes, said plurality of modules being parallel connected to each other by the source and drain electrodes; and a plurality of drive circuits, each mounted to a respective one of the sheet metal substrates and operatively connected to the commonly connected gate electrodes, each drive circuit being operable to turn the field effect transistors of the corresponding module to the off state and to the on state.

It is to be understood that both the foregoing general description and the following detailed description are exemplary and explanatory, and are intended to provide further explanation of the invention as claimed. The accompanying drawings are included to provide a further understanding of the invention and incorporated in and constitute a part of this specification, illustrate one embodiment of the invention, and together with the description serve to explain the principles of the invention.

DESCRIPTION OF PREFERRED EMBODIMENT

Reference will now be made in detail to the present preferred embodiment of the invention, an example of which is illustrated in the accompanying drawings.

Figure 1:
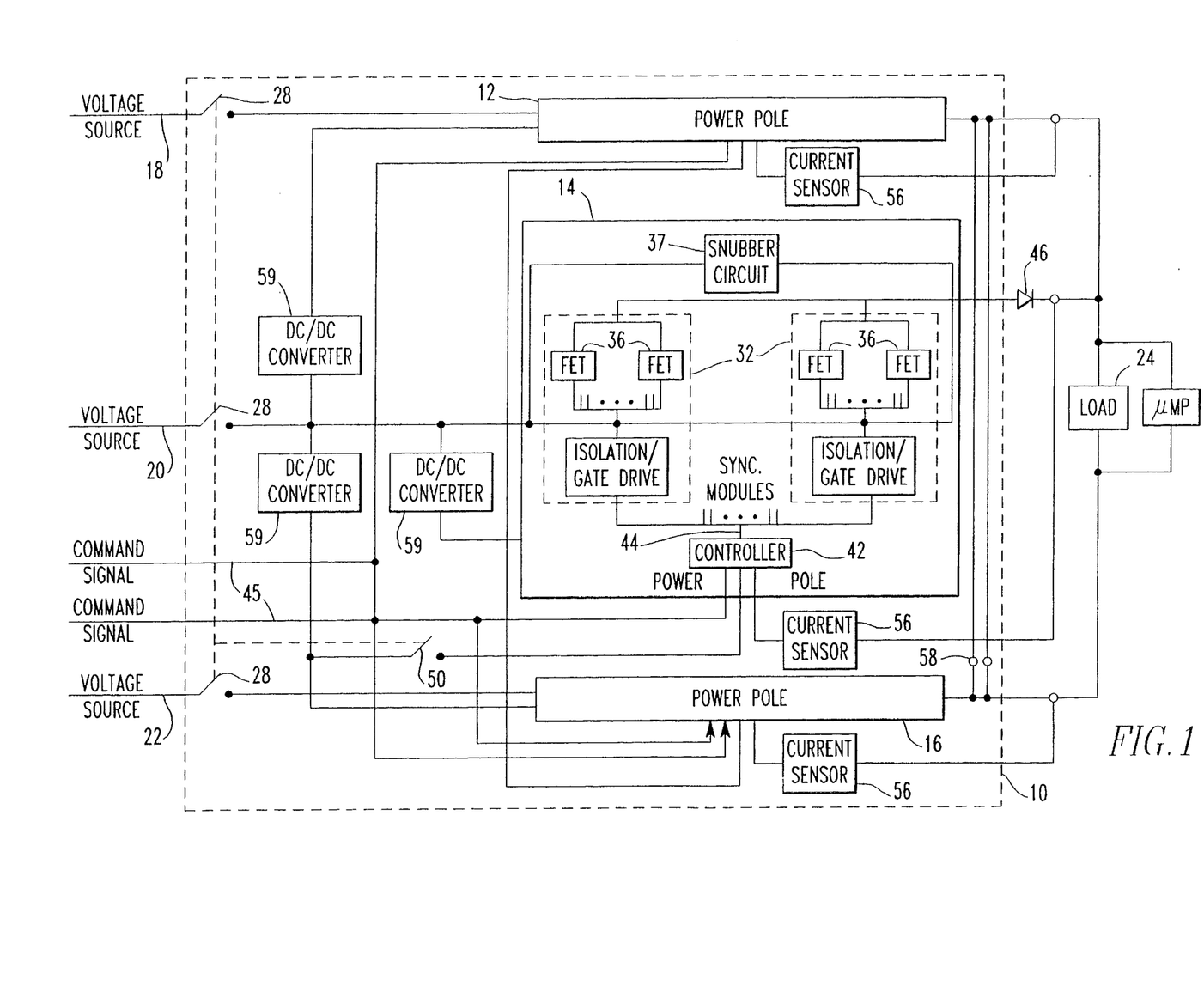
FIG. 1 is a schematic block diagram of a solid state circuit breaker in accordance with the present invention.

An exemplary embodiment of a circuit breaker incorporating the present invention is shown schematically within the dashed lines referred to as 10 of FIG. 1, and in which like references characters refer to like or similar components. The solid state circuit breaker 10 includes a plurality of current carrying power poles 12, 14 and 16 each having an input for connection to a DC power source and an output for connection to an electrical load. As shown in FIG. 1, power pole 12 has an input for connection to a voltage source 18. Power pole 14 has an input for connection to another voltage source 20; and power pole 16 has an input for connection to a common return for the voltage sources 18 and 20 referred as 22. The power poles 12, 14 and 16 have an output for a connection to an electrical load 24. The circuit breaker 10 includes a mechanical disconnect for each of the power poles 12, 14, and 16. As shown in FIG. 1, a mechanical switch 28, is included in each of the power poles 12, 14, and 16. The mechanical switches 28 for each of the power poles are operative when closed to permit the flow of DC current in the respective pole and operative when open to interrupt the flow of current in the respective pole. Although shown only in power pole 14 for the sake of simplicity of illustration, the circuit breaker 10 also includes a solid state relay 30 in each of the power poles 12 and 16. The solid state relays 30 are operative when conducting to permit the flow of DC current in the respective pole and operative when non-conducting to interrupt the flow of current in the respective pole when the corresponding mechanical switch 28 is closed.

In accordance with the present invention a solid state relay comprises a plurality of individual modular stacked switching circuits and a snubber circuit. Each of the individual modules comprises a thin sheet metal heat dissipating substrate with a plurality of field effect transistors mounted on each substrate.

Figure 2:
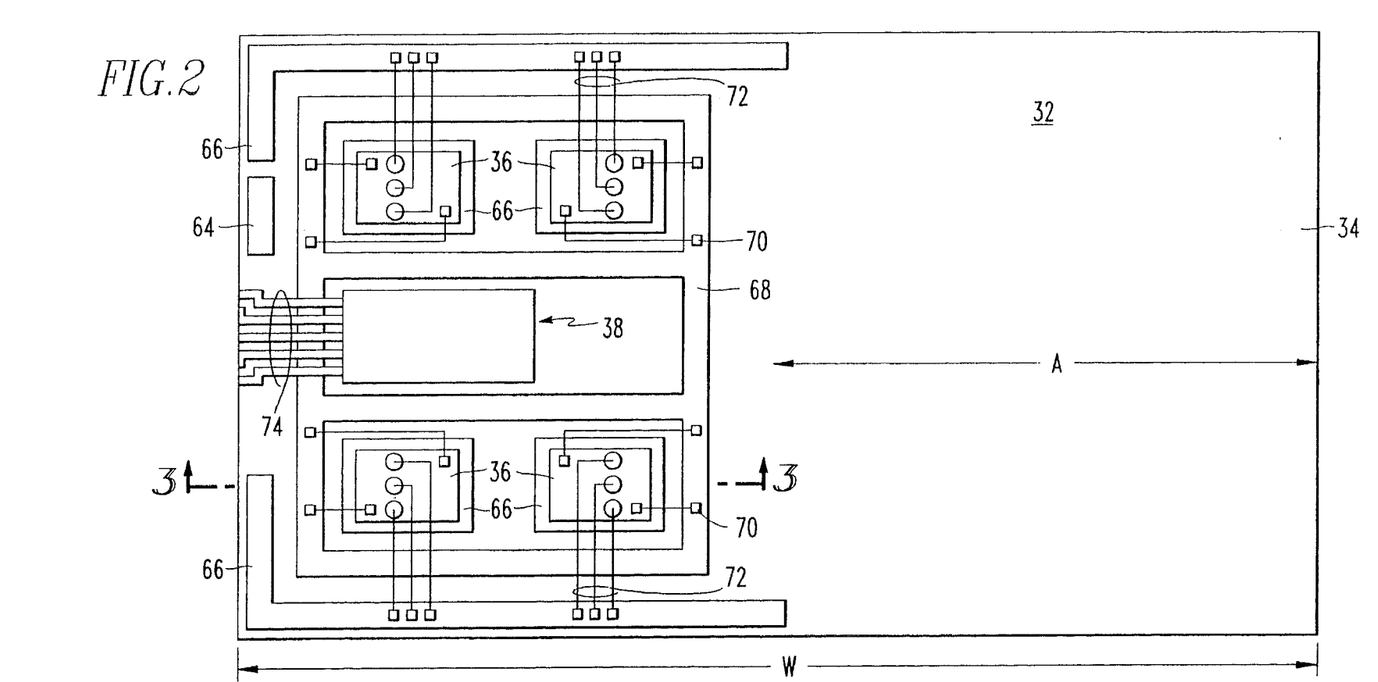
FIG. 2 is a schematic top view of a field effect transistor switching module constructed in accordance with the present invention.

As herein embodied and referring to FIGS. 1 and 2 each module 32 of the relay 30 includes a thin sheet metal substrate 34, a plurality of field effect transistors 36 and an isolation and gate drive circuit 38. A controller circuit 42 has an optical output 44 which is connected to each of the circuits 38 in parallel. The circuitry 42 is responsive to an external command signal to transmit an optical signal to the optical isolation and gate circuit 38 which in turn is converted to an electrical signal to switch on or off the corresponding solid state relay 30.

Prior to discussing the solid state relays and the arrangement of the individual switching circuit modules of the present invention, the overall structure and operation of the circuit breaker 10 incorporating the principles of the present invention will be described. As previously mentioned, external DC voltage is applied to the breaker 10 through the power poles 12, 14, and 16 when the mechanical contactors 28 are closed and the solid state relays 30 are in the on state. In the illustrated circuit breaker, two different voltages may be applied for different operating modes of the load. When the load calls for a particular voltage, the voltage source 18, for example, is energized, thus supplying the voltage from source 18, which may be higher than voltage source 20 to the load 24. The voltage at source 20 may continue to be applied to the power pole 14, but a remote blocking diode 46 is reverse biased and no current would flow from the voltage source 20. A clamp 48 across the load 24 limits voltage spikes that may be generated if the load is inductive and current through the load is interrupted by the breaker. The mechanical disconnect switch with contacts 28 is a manually operated electromechanical switch that can interrupt the current to the load if the solid state relays 30 should fail in the shorted condition. The mechanical switch may also be used to provide a greater degree of isolation between the voltage sources and the load than can be provided by the turned-off field effect transistors 36 which have a finite resistance and capacitance. The mechanical disconnect switch contacts 28 also provides an alternate method of disconnecting the load 24. A contact limit switch 50 senses that the mechanical switch 28 is starting to open. The limit switch 50 then provides a signal to the controller 42 which turns the field effect transistors 36 of the relays 30 to the off condition. This causes the current to go to zero before the mechanical disconnect switch is opened, thus preventing the destructive arcing of contacts 28. The controller 42 also receives an external signal at input 43 to turn the breaker 10 on or off, and transmits this signal to the three poles 12, 14, and 16 over line 45. A local switch (not shown) may also be provided that performs the same function. A snubber circuit 37 is provided for each solid state relay, and limits the voltage across each of the field effect transistors caused by inductance within the related relay. Each snubber circuit 37 is connected across the corresponding power pole in parallel with the corresponding solid state relay. Current sensors 56 are also provided for each of the three poles 12, 14, and 16. Sensors 56 create a signal that turns off solid state relays of the breaker if the current exceeds a preset level, which protects the load from potentially damaging currents. Local indication of the status of the breaker is shown by indicators such as red and green light emitting diodes 58. Remote indication may also be provided. DC/DC converters 59 each has an input connected to respective poles 12, 14, and 16 to provide a supply voltage at a substantially lower level for the electronic circuitry of the solid state relays 30. The DC/DC converter outputs are connected to the controller, isolation, and drive circuits 38 of the solid state relays 30.

As previously mentioned, each of the solid state relays 30 are comprised of a plurality of individual switching circuit modules. In accordance with the invention, each of the switching modules comprise a sheet metal heat dissipating substrate having opposite surfaces with a layer of dielectric material overlaying a portion of the total area of at least one of the opposite surfaces. As herein embodied, and referring to FIGS. 2 and 3 the switching circuit module 32 has a sheet metal substrate 34 with an insulating layer 60 overlaying approximately half of the total area of one surface of the substrate. The exposed portion as indicated by arrow A serves as a heat sink for the module 32. The substrate 34 is preferably a thin sheet of copper with a molybdenum insulating layer 60. However, the substrate 34 may be aluminum or any other heat conducting metal. Preferably, the sheet metal substrate has a thickness in the neighborhood of five hundredths (0.05) of an inch.

Figure 3:
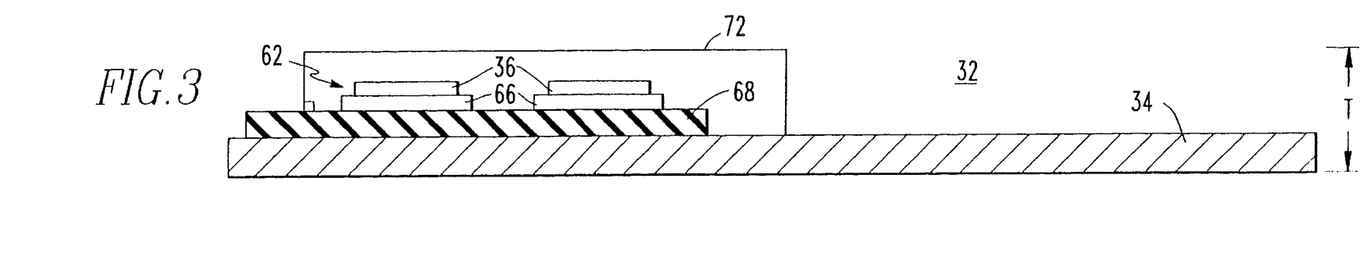
FIG. 3 is a sectional view of the switching module of FIG. 2 taken along line 3—3 of FIG. 2.

As provided by the present invention, a metallic circuit pattern overlays the layer of dielectric or insulating material. As herein embodied, a circuit pattern 62 is laminated and etched on the insulative dielectric layer 60. The layer 62 is preferably copper and a portion thereof provides a base for the plurality of field effect transistor chips 36, the copper circuit pattern 62 is configured to provide drain electrodes 64, a source electrodes 66 and a gate electrode 68. The drain and source electrodes could be interchanged such that the FET sets on the drain plane; and the wire bonds are used to complete the source connection. Gate resistors are also provided at 70. The field effect transistors 36 are connected by bond wires 72 to the various electrodes 66 and 70. As previously mentioned, the source 66 of each of the field effect transistors 36 are connected in common to the metal electrode area 66', the drain portion of the field effect transistors are commonly connected to drain electrode 64 and the gate portion of the transistors are commonly connected to the gate electrode 68 through gate resistors 70. The field effect transistors 36 are preferably silicon or silicon carbide field effect transistors. Although silicon transistors have a low forward resistance, for applications of a very high DC current and a limited circuit breaker space, silicon carbide field effect transistors are preferable. In one actual reduction to practice, solid state switching modules 32 were each approximately 3¼ inches wide in the dimension referred to as W of FIG. 2 with the heat sink portion A having a dimension approximately 2 inches in width. As shown in FIG. 3 the field effect transistors 36 are coated with a silicon gel type material, encased in plastic, or covered with a suitable type of plastic covering 72. The dimension T or thickness of each one of the switching modules 32 is approximately 0.3 of an inch. Thus, a substantial number of individual cards of relatively small dimension can be stacked into a single rack for mounting in a relatively small circuit breaker space. The drive circuits 38 are provided on each card 32 and connected to the gate electrode 68. The optical isolator circuit 40 has an input and power supply voltages 74 for activating the drive circuit 38. The switch resistance resulting for parallel operation of 22-24 silicon field effect transistors (MOSFETs) each having 0.2 of an ohm resistance while conducting is approximately 8 milliohms. Each card 32 can carry 12 amperes of current with 1.2 watts of dissipation. Thus, to make a 300 ampere pole, twenty-five of the modules 32 are required. At 0.3 of an inch in thickness T, they readily fit in a small dimension such as 8 inches for example.

Figure 4:
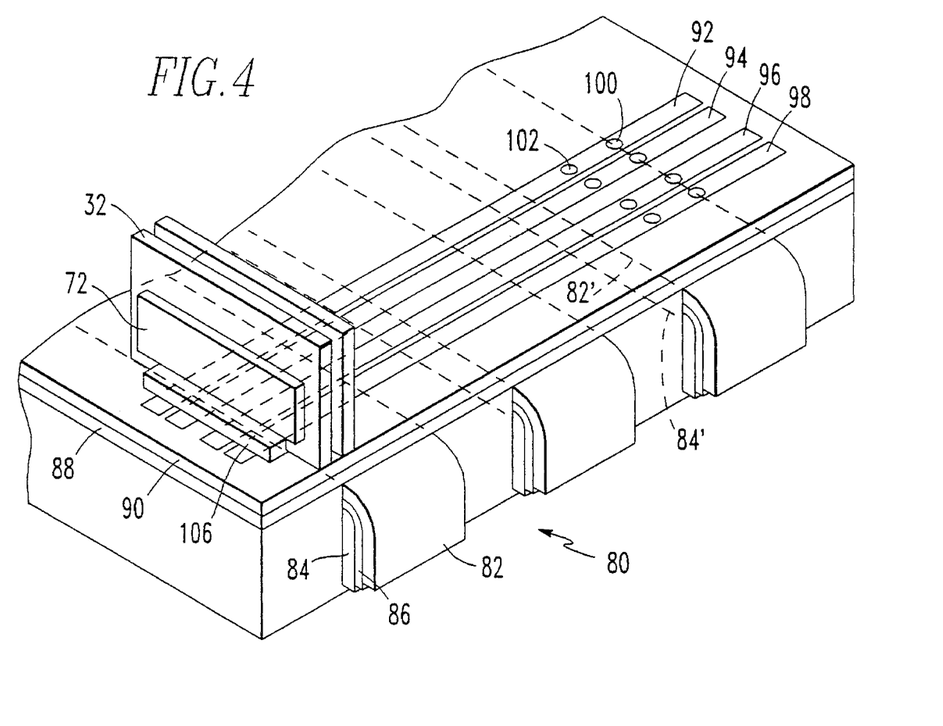
FIG. 4 is a fragmentary three dimensional view showing the individual solid state switching modules mounted to a circuit breaker to constitute a solid state relay in accordance with one embodiment of the invention.

In accordance with the present invention, a plurality of the individual switching circuit cards are stacked and placed in a suitable rack to constitute a solid state relay. As shown in FIG. 4, the solid state relay 30 is comprised of a plurality of individual switching circuit modules 32 that are connected electrically in parallel by commonly connected source and drain electrodes of each module, which are in turn in parallel with the commonly connected source and drain electrodes of the other modules of the stack to constitute a solid state relay.

Referring to FIG. 4, solid state relays 30 are connected at a flange 88 to an enclosure that holds the components similar to 10 of FIG. 1. The housing 80 has bus bar type conductive layers for connecting each of the power poles in a DC system. Layers 82 are input layers and layers 84 are output conductive layers for each of the power poles 12, 14, and 16, for example. The layers 82 and 84 of each pole are electrically isolated from one another by a suitable insulation layer 86. Layers 82' and 84' extend across the board 88. A mother board 90 has a plurality of conductive strips 92, 94, 96, and 98 which extend substantially perpendicular to the bus bar layers 82' and 84'. These strips distribute the input and output connections to all the modules of one pole. The conductive strips have through holes 100 which electrically connect the strip 92 and 98 to the layer 82 and through holes 102 which electrically connect strip 94 and 96 to the layer 84 for example. Mounted to the mother board are a plurality of connectors 106 (only one is shown) for plugging in each of the modules 32 in a switch relationship so that the source and drain regions of the parallel connector transistors are electrically coupled to the bars 82' and 84' via the strips 92, 94, 96 and 98 in parallel. With this arrangement, a solid state relay for different DC current carrying capacity can be easily fabricated in accordance with the number of modules that are plugged into the edge connectors 106. The input to the opto-isolator and drive circuits (not shown) are also converted to each one of the edge connectors 106.

Figure 5:
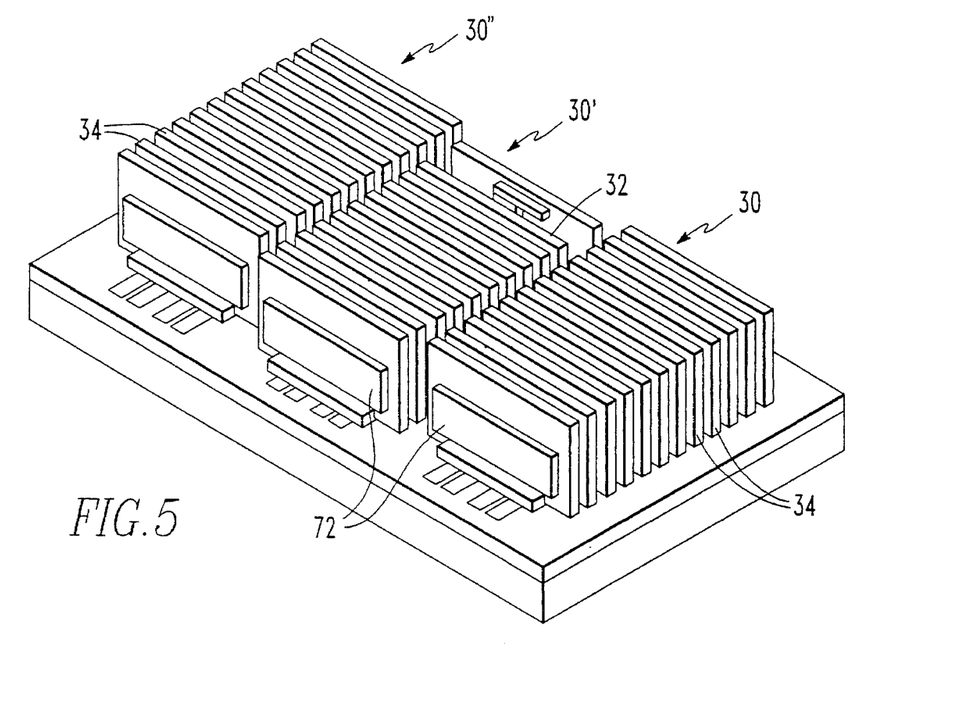
FIG. 5 is a view in perspective of a solid state relay portion of the circuit breaker of FIG. 1 showing an arrangement of the individual circuit cards of FIG. 2 in providing a module for each of the power poles of the circuit breaker of FIG. 1.

In accordance with the present invention, individual solid state relays are arranged side by side, preferably in an offset relationship to provide for a compact structure and appropriate natural free air ambient cooling. Referring to FIG. 5 as herein embodied, solid state relay 30 is stacked next to a solid state relay 30' which in turn is stacked next to a solid state relay 30". Thus, a circuit breaker for a DC current system of several hundred amperes can be mounted in a relatively small area. The stack of cards 32 forming the solid state relay 30' may be connected in parallel to the pole 12 on which the stack is mounted. The solid state relay 30' may be connected to pole 14 on which it is mounted; and solid state relay 30" may be mounted on pole 16, for example. The physical size of the unit and cooling available dictates the number of individual switching circuit cards or modules making up a particular solid state relay, as well as the number of field effect transistors on each individual switching circuit card. Also of importance is the physical dimensions of the heat fin area and the operating temperatures which determine the optimal size and spacing of the heat fins.

As shown in FIG. 5, the heat fin portions 34 of each module 32 of each solid state relay 30, 30', 30" have a space therebetween that is slightly greater than the thickness T of each module to accommodate an edge connector, such as 106 at FIG. 4. Because of the relatively small space as heretofore described, the relays are subject to a boundary layer effect, which is caused by the inability of the ambient air to circulate and provide natural cooling to the individual modules. In order to provide adequate cooling for high currents the edge of the substrate 34 of each module 32 is aligned with the space between stacked modules of the adjacent relay. For example, the edges of the modules 32 for relay 30 are aligned with the space between modules of relay 30". In turn, the edge of each of the modules 32 of the relay 30' are aligned with the spaces between the modules of the relay 38". This offset disturbs the boundary effect and provides improved cooling. Although, each of the modules are stacked in the same orientation, it is contemplated that adjacent modules of each relay, or the modules of adjacent relays can be oriented in several ways, such as by front to back, as shown, or back to back and front to front, for example.

Figure 6:
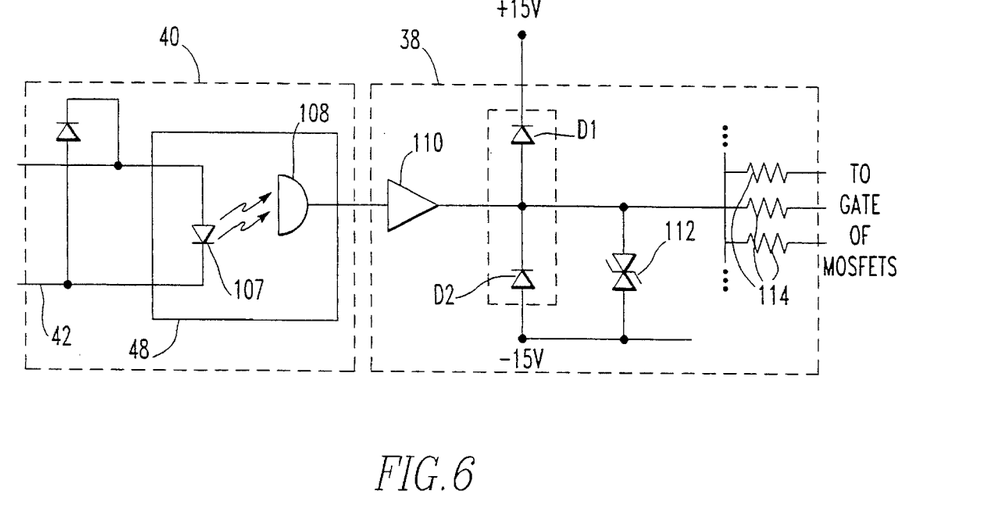
FIG. 6 is a circuit diagram of an optical isolator and FET drive circuit mounted on each of the switching modules of FIG. 2.

Referring to FIG. 6, the optical isolator 48 couples digital logic input and output signals and includes a photodiode such as 107, with a detector 108 which is sensitive to the light signals of 107. In other words, the optical isolator portion 40 is used to provide the voltage isolation and to transfer the transistor/transistor logic on/off command to the transistor/transistor logic output isolated voltage. The drive circuit 38 includes an MOS gate drive 110 which translates the 5 volt, which is the TTL output voltage of the isolator circuit to the 15 volt level required to charge and discharge the gate capacitance of the parallel connected field effect transistors 36. Clamping diodes D1 and D2 are used to clamp the output of the gate drive 110 to the supply voltage, which in the present embodiment is 15 volts. Zener diodes 112, are used to limit the gate voltage to 15 volts and to protect the gate drive in the event of failure of the field effect transistors. Resistors 114 are selected to set the switching time of the parallel connected field effect transistors 36 of each of the modules 32 in conjunction with the drain to gate capacitance of the field effect transistors. Resistors 114 are also used to dampen the gate drive oscillations.

Figure 7:
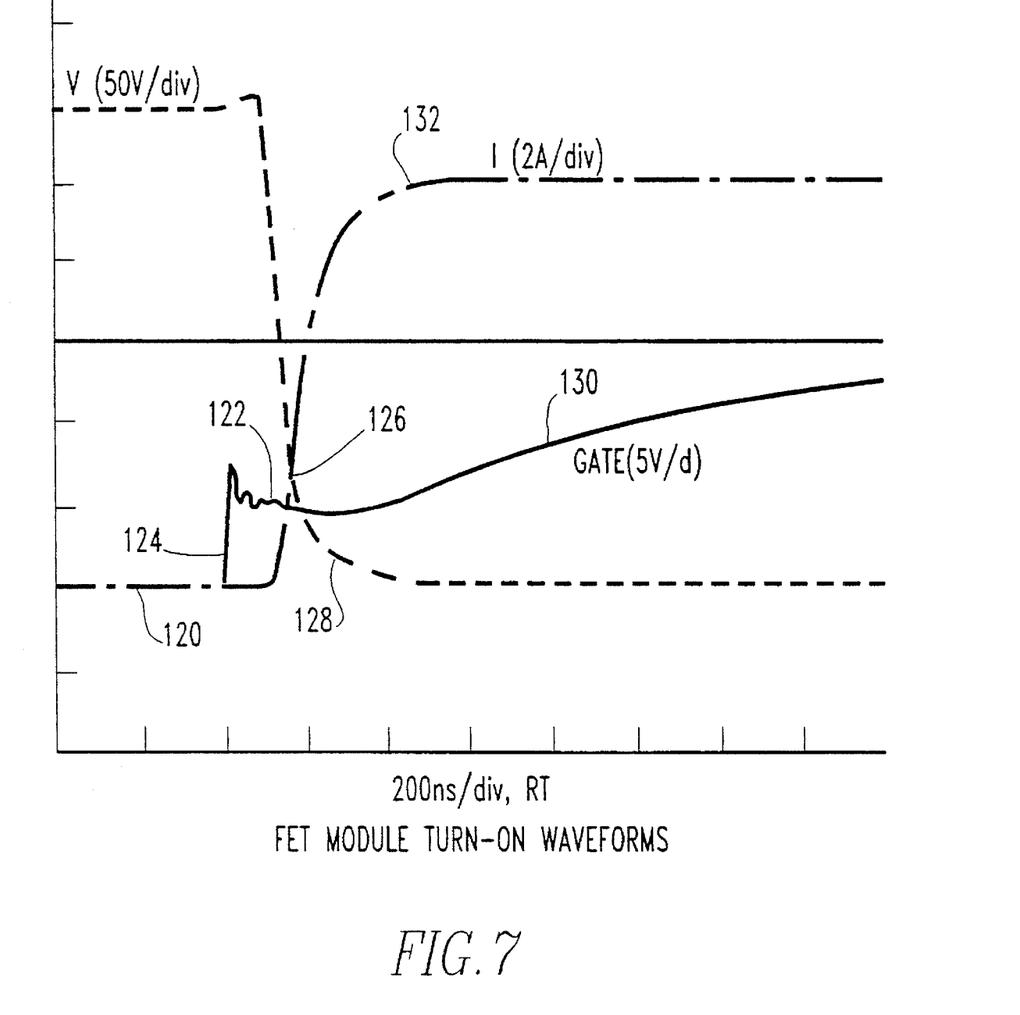
FIG. 7 is a voltage and current waveform diagram of the optical isolator and drive circuit of FIG. 6 in turning on the field effect transistors of the switching module of FIG. 2.

Referring to FIGS. 6 and 7, in conjunction with FIG. 5 a primary consideration in addition to the number of field effect transistors used in each switching card is the gate drive requirement. Field effect transistors require zero gate bias when off and a positive bias typically +15 volts when in the on state. The leakage currents required to maintain these states are minimal. It is only while the state is being changed that the gate drive is critical. In order to change states, two capacitances must be charged. The first of these is the gate/source capacitance which must switch between +15 volts and zero. The second is the gate/drain capacitance which charges as the switch output voltage changes. This second capacitance may be used to control the output voltage rise time. Referring to FIG. 7, given a constant current drive circuit represented by line portion 120 and linear capacitances, the gate voltage represented by line 122 rises as shown at 124 as the gate source capacitance changes.

Figure 8:
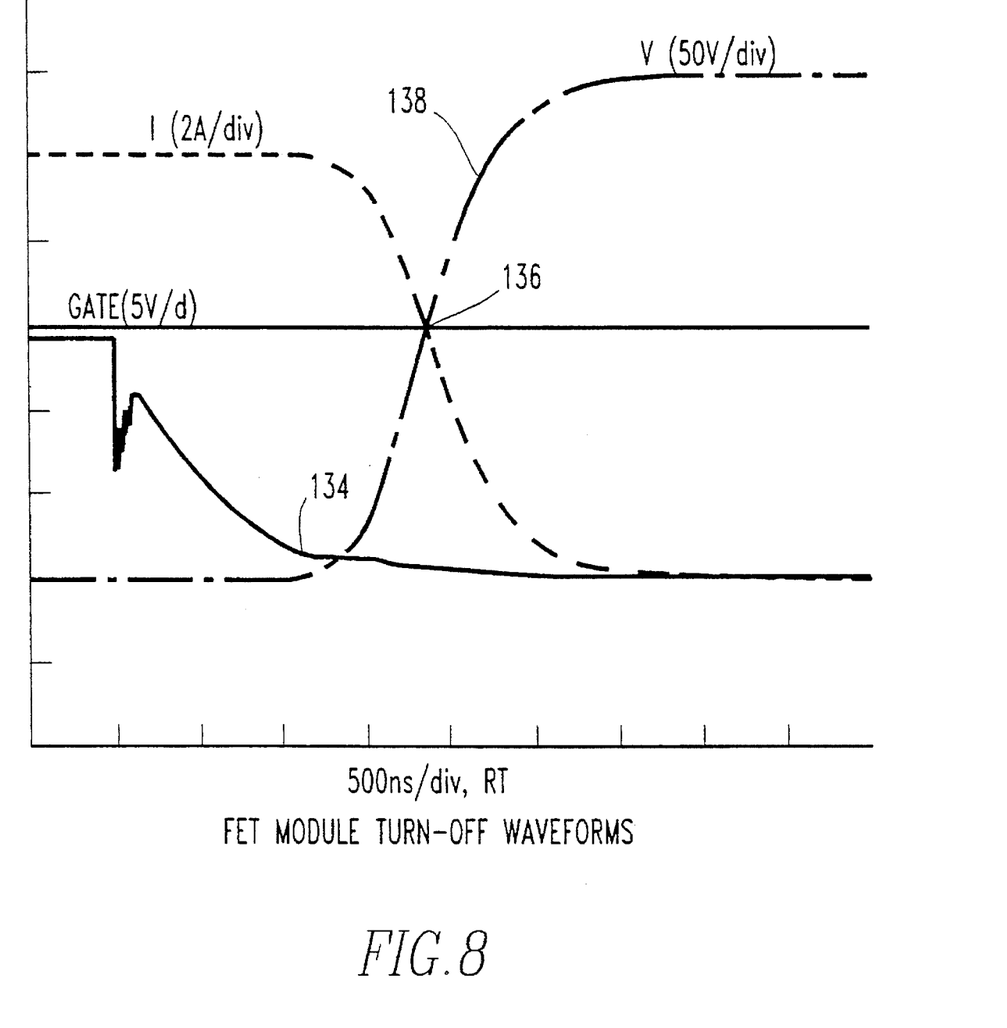
FIG. 8 is a waveform of the current and voltage in the drive circuit when the field effect transistors of the switching module of FIG. 2 are turned off.

It then holds roughly constant as the switch turns on at point 126 of the graph and output voltage falls as represented at 128 charging the gate drain capacitance. The gate voltage then rises as shown at portion 130 of the gate voltage waveform as the gate source capacitance completes its charge. Line 132 is the rising output current as the switch turns on. Referring to FIG. 8, when the field effect transistor module 32 is in the on or conducting state, the gate voltage represented by line 134 as the gate source capacitance charges and holds roughly constant as the switch turns off at point 136 and the output voltage on line 138 rises discharging the gate drain capacitance and then stays constant as the gate source capacitance completes its charge. In the present embodiment, a relatively slow controlled rate of output voltage change represented by lines 130 and 134 of FIGS. 7 and 8 respectively is accomplished by including the large resistor 114 (see FIG. 6) which may be in the neighborhood of 100 to 10,000 ohms for example. This has the added benefit of isolating possible oscillations. In the present embodiment of the invention, with the gate drive circuit as previously described each individual field effect transistor chip is operated substantially below its rated capacity such that gross mismatches of current sharing are tolerable. This is particularly the case during the turn off of the field effect transistors. All devices differ in the values of the their gate capacitances, gate resistors, and threshold voltages. Assuming that most of the field effect transistors of each card 80 turn off early, leaving just a few stragglers to handle the entire turn off current. A fully biased field effect transistor saturates at about 100 amperes, so at least three field effect transistors will share the turn off current. The transistors carry this full current while the output voltage rises from zero to as much as 500 volts, dissipating the power of the current times the voltage. Over the one microsecond transition time each of these three field effect transistors absorbs an average power of 25 kilowatts, resulting in a temperature rise of a modest 25° C. When we consider that switching is performed only occasionally this temperature rise is acceptable. Under actual operating conditions we can determine the worst case bias variations during turn off, which will limit the current per FET to approximately 10 amps with a temperature rise of only 2.5° C.

In summary, we have described a solid state relay that is capable of being fabricated to any desired current rating by using the appropriate number of standard modules. As described in detail, each module 30 consists of a number of MOSFETs mounted on a flat printed circuit substrate which doubles as a heat fin. The module includes drive circuitry for the field effect transistors and is controlled by an optically isolated input signal. With respect to the arrangement of solid state relays, the arrangement described in connection with FIG. 5 provides three rows of fins, each 3½ inches by 1.35 of an inch, that are spaced 0.32 of an inch apart. With this spacing in size, each fin can dissipate just over 1 watt with a temperature rise of 30° C. above ambient. Where silicon carbide field effect transistors are utilized, it is feasible to use either fewer transistors on each card, or fewer cards, depending upon the practical application because of the substantially lower resistance of the silicon carbide field effect transistors when continually conducting current.

Thus, we have provided a flexible, affordable structure for very low loss solid state relays for high power applications. The use of an integral heat fin and circuit card to carry a small number of field effect transistors, such as twenty-four, for example, and an associated drive and isolation circuitry greatly simplifies the manufacturing and improves the yield, while at the same time providing versatility for different applications. The inserting of the heat fin circuit cards in edge connectors for optimal arrangement of the heat fins maximizes convective cooling. The arrangement is relatively simple and may be customized for any particular installation.

It will be apparent to those skilled in the art that various modifications and variations can be made in the circuit breaker and solid state switching relays of the present invention without departing from the spirit or scope of the invention. Thus, it is intended that the present invention cover the modifications and variations of this invention provided they come within the scope of the appended claims and their equivalents.

What we claim is:

1. A solid state circuit breaker, comprising
   a plurality of current carrying power poles, each having an input for connection to a DC power source, a solid state switching relay, and an output for connection to an electrical load;
   each solid state switching relay including a plurality of individual stacked switching circuit modules, each switching module including a sheet metal heat dissipating substrate having mounted thereon a plurality of field effect transistors with commonly connected source electrodes, commonly connected drain electrodes, and commonly connected gate electrodes, said plurality of modules being parallel connected by the source and drain electrodes between the DC power source and the electrical load;
   a drive circuit mounted to each of the plurality of substrates and connected to the commonly connected gate electrodes, the drive circuit being operable to a first condition to turn the field effect transistors to the off state and operable to a second condition to turn the field effect transistors to the on state; and
   means for operating the drive circuit to the first and second condition.

2. The solid state circuit breaker of claim 1 wherein the plurality of field effect transistors comprise silicon metal oxide semiconductor field effect transistors.

3. The solid state circuit breaker of claim 1 wherein the plurality of field effect transistors, comprise silicon carbide metal oxide semiconductor field effect transistors.

4. The circuit breaker of claim 1 wherein the means for operating the drive circuit comprises a controller circuit coupled to each of the drive circuits of each module and responsive to an external command signal to operate the drive circuit to the first and second condition.

5. The circuit breaker of claim 4 wherein the coupling means comprises an optical isolation circuit for each drive circuit connected between the output of the controller and the input of the drive circuit operative to electrically isolate the command signals.

6. The circuit breaker of claim 1 further comprising a DC to DC converter for each of the plurality of poles connected in parallel with the plurality of switching cards to supply a reduced operating voltage to each of the drive circuits.

7. The circuit breaker of claim 1 wherein each of the plurality of switching modules comprise, a sheet metal substrate having opposite surfaces;
   a layer of dielectric material overlaying a pre-selected fraction of a total area of one of the opposite surfaces;
   a metal circuit pattern overlaying the layer of dielectric material and commonly connecting the source electrodes, the drain electrodes, and the gate electrodes of the field effect transistors, said field effect transistors being mounted on the fraction of the substrate occupied by the dielectric layer, the remaining fraction of both opposite surfaces of the substrate being exposed to ambient to serve as a heat sink for the plurality of mounted transistors.

8. The circuit breaker of claim 7 further comprising a dielectric material covering the plurality of mounted field effect transistors.

9. A solid state switching relay comprising:
   a plurality of switching circuit modules, each module including a sheet metal substrate having a heat dissipating portion, a plurality of field effect transistors with commonly connected source electrodes, commonly connected drain electrodes, and commonly connected gate electrodes mounted on non-heat dissipating portions of the substrate, said plurality of modules being parallel connected to each other by the source and drain electrodes; and
   a drive circuit mounted to each of the plurality of switching circuit modules and connected to the corresponding commonly connected gate electrodes, the drive circuit being operable to a first condition to turn the field effect transistors of the corresponding module to the off state and operable to a second condition to turn said transistors to the on state.

10. The solid state switching relay of claim 9 wherein the plurality of field effect transistors comprise silicon metal oxide semiconductor field effect transistors.

11. The solid state switching relay of claim 9 wherein the plurality of field effect transistors comprise silicon carbide metal oxide semiconductor transistors.

12. The switching relay of claim 9 wherein each of the plurality of switching modules, comprise;
    a layer of dielectric material overlaying a portion of the total area of one of the opposite surfaces of the substrate defining a non-heat dissipating portion underlying the field effect transistor; a metallic circuit pattern overlaying the layer of dielectric material and commonly connecting the source electrodes, the drain electrodes, and the gate electrodes of the field effect transistors, the surface portion of the substrate without the dielectric layer serving as a heat sink for the plurality of mounted transistors.

13. The switching relay of claim 12 further comprising dielectric material covering the plurality of field effect transistors.

14. A solid state switching module for a solid state relay, comprising
    a sheet metal substrate having opposite surfaces with a predetermined total area;
    a layer of dielectric material overlaying a portion of the total area of one of the opposite surfaces defining a non-heat dissipating portion;
    a metallic circuit pattern overlaying the layer of dielectric material;
    a plurality of field effect transistors connected to the circuit pattern and having commonly connected source electrodes, commonly connected drain electrodes, and commonly connected gate electrodes, said field effect transistors being mounted on the portion of the substrate occupied by the insulative layer, the remaining surface portion or the substrate being exposed to ambient to serve as a heat dissipating portion for the plurality of mounted transistors;
    a gate drive circuit portion mounted overlaying the insulative layer and having an output coupled to the commonly connected gate electrodes, the drive circuit being operable to a first condition to turn the field effect transistors to the off state and operable to a second condition to turn the transistors to the on state; and an optical isolator circuit mounted overlaying the dielectric layer having an output connected to an input of the gate drive circuit.

15. The solid state switching module of claim 14 wherein the plurality of field effect transistors comprise silicon metal oxide semiconductor field effect transistors.

16. The solid state switching module of claim 14 wherein the plurality of field effect transistors, comprise silicon carbide metal oxide semiconductor field effect transistors.

17. The solid state switching module of claim 14 wherein the module has a thickness dimension extending perpendicular to the sheet metal substrate surface approximately three-tenths of an inch including thickness of the substrate.

* * * * *